United States Patent [19]

Muramatsu et al.

[11] Patent Number: 4,800,346

[45] Date of Patent: Jan. 24, 1989

[54] DELAY LINE AND ITS MANUFACTURING METHOD

[75] Inventors: Masayauki Muramatsu, Iruma; Toshiki Morozumi, Yokohama, both of Japan

[73] Assignee: Delphi Company Ltd., Tokyo, Japan

[21] Appl. No.: 49,142

[22] Filed: May 13, 1987

[30] Foreign Application Priority Data

| May 19, 1986 | [JP] | Japan | 611986 |
| Jul. 3, 1986 | [JP] | Japan | 611986 |
| Aug. 26, 1986 | [JP] | Japan | 611986 |

[51] Int. Cl.$^4$ ............................. H03H 7/18
[52] U.S. Cl. ........................... 333/140; 333/156; 333/161; 29/602.1
[58] Field of Search ............... 333/138, 140, 161, 156; 336/200, 232; 361/400, 402; 29/602 R, 827

[56] References Cited

U.S. PATENT DOCUMENTS

| 3,141,144 | 7/1964 | Watts, Jr. | 333/161 |
| 3,257,629 | 6/1966 | Kornretch | 333/161 |
| 3,490,055 | 1/1970 | Cox | 361/402 X |
| 3,585,535 | 6/1971 | Seuf | 333/161 |
| 3,602,846 | 8/1971 | Hauser | 333/138 X |
| 4,203,081 | 5/1980 | Braeckelmann | 333/138 |
| 4,272,741 | 6/1981 | Vanderknyff | 333/138 |
| 4,547,961 | 10/1985 | Bokit et al. | 29/609 R |
| 4,591,814 | 5/1986 | Ito et al. | 333/185 X |
| 4,626,816 | 12/1986 | Blumkin et al. | 336/200 X |
| 4,641,112 | 2/1987 | Kohayakawa | 333/138 X |
| 4,649,356 | 3/1987 | Kameya | 333/138 |

FOREIGN PATENT DOCUMENTS 61-45616  3/1986  Japan .

Primary Examiner—Eugene R. LaRoche
Assistant Examiner—Seung Ham
Attorney, Agent, or Firm—Wenderoth, Lind & Ponack

[57] ABSTRACT

A lumped constant delay line has a substrate, capacitor element disposed on one surface of the substrate provided with a through hole therein, an inductor electrode which is dispossed on the other surface of the substrate and is connected to the capacitor elements by means of a through hole conductive section consisting of coated inside wall of the through hole by means of conductive adhesive and an inductor pin soldered onto the inductor electrode while a distributed constant type delay line has an insulating substrate on which a ferrite layer, an inductance layer, a dielectric layer and a ground electrode layer are superposed one after another and a wiper makes sliding on a wiper base composed of a group of parallel taps which are led out from the meandering paths of the inductance conductive layer and converged toward one side of the insulating substrate whereby to cause variation of delay time of the delay line.

9 Claims, 4 Drawing Sheets

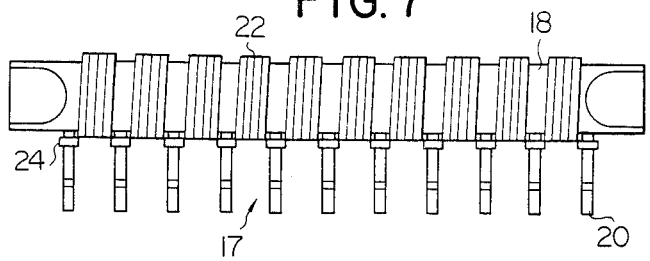
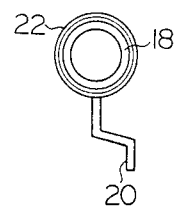
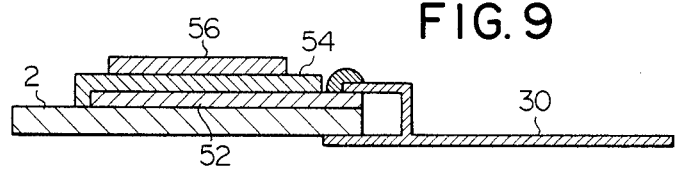
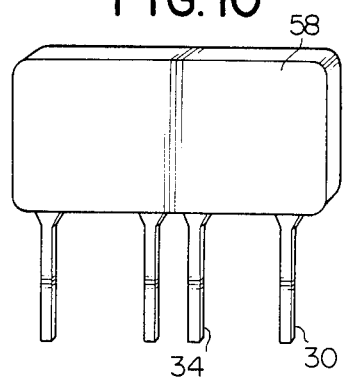
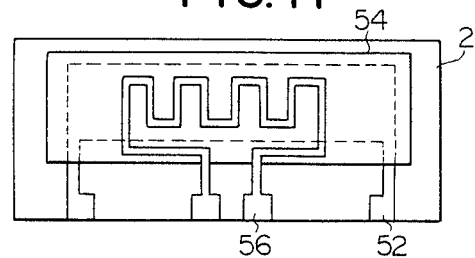

DELAY LINE AND ITS MANUFACTURING METHOD

BACKGROUND OF THE INVENTION

This invention relates a electromagnetic delay line and the manufacturing method thereof and particularly to a DIP lumped constant type delay line, to a variable distributed constant type delay line, and specifically to an SIP (Single-in-Package) distributed constant type delay line each having a small thickness.

A conventional lumped constant type delay line is formed by a plural number of inductance elements L1, L2, L3, L4 . . . and so on, each consisting of a ferrite bobbin having an I-shaped cross section around the body of which are wound enamel clad copper wires each of which is continuously disposed over the upper surface of an insulating substrate, and by a plural number of laminated ceramic condenser elements C1, C2, C3, C4, . . . and so on each of which is disposed continuously over the lower surface of the insulating substrate. A group of inductance elements and condenser elements will hereinafter be referred to simply as an inductor and a capacitor, respectively. The aforementioned inductor and capacitor are connected by conductive wires by connecting L1 and C1, L2 ad C2, L3 and C3 . . . and so on, respectively, thereby constituting a lumped constant type delay line circuit.

However, the conventional lumped constant type delay line is difficult to reduce in size especially in thickness because it is almost impossible to procure component parts for assembling which are smaller in shape. This structural limitation makes it harder to adopt an automation system in the production process thereof. Thus, much of the manufacturing process requires manual labor. Furthermore, the conventional distributed constant type delay line, especially one designed for a shorter delay time, has a drawback of creating an uncomputable inductance prevailing in the conductive wire connecting the inductor elements and capacitor elements, which prevents a high yielding of production and causes a higher manufacturing cost thereof.

An object of the present invention is to provide a lumped constant type delay line having a very small thickness but exhibiting superior performance that can be manufactured with lesser man-hours thereby overcoming the aforementioned problem.

A lumped constant type of delay line publicized in Japanese provisional publication (kokai-koho) showa 61 (1986)-45616 presents a structure wherein a connecting pin of an inductor bobbin is inserted into a through-hole defined in a substrate over the surface of which capacitor elements are disposed and the pin is immovably fastened to the substrate by applying solder paste or adhesive around the upper edge of the pin which is located within the through-hole to thereby connect the capacitor elements and the inductor elements.

However, Sn or Pb, a component of solder paste or other adhesive applied around the upper edge of the pin or over the capacitor elements tends to diffuse and cover the surface of the capacitor element or penetrate into the through-hole and cause an undesirable electrical connection.

Another object of this invention is to provide a lumped constant type delay line which provides an alternative to the use of solder paste or the like which can diffuse over the capacitor or into the through-hole whereby a normal electric connection between the capacitor and the pin terminal is obtained.

A conventional distributed constant type delay line of an SIP type has an insulating substrate on one surface of which is disposed a ground electrode layer, and on another surface of which an inductance conductive layer is disposed. Thus, the insulating substrate functions as a dielectric to form a delay line circuit. The insulating substrate has an alumina base ($Al_2O_3$ 90-99%) having dielectric constant of s=8-11. Furthermore, the ground electrode layer and inductance conductive layer are formed by a thin layer of neckle film or the like, respectively.

One end of the insulating substrate extends between bifurcated ends of a lead terminal, each end thereof being fitted by soldering paste to one end of the ground electrode layer and one end of the inductance conductor layer, respectively, to effect electrical connection therebetween.

The structure of the conventional distributed constant type SIP delay line also involves some problems. An alumina base substrate adopted as a dielectric usually has a fixed dielectric constant(s) which tends to put some limitation on designing various types of delay lines having a different delay time and characteristic impedance because of the thickness of the substrate is only the factor available to create fluctuations of capacitance as long as a balanced relation between a delay time and characteristic impedance exist within a limit based on the following equations:

$$L = Td \cdot Zo$$

$$C = Td/Zo$$

where:
Td: Delay time
Zo: Characteristic Impedance
L: Inductance
C: Capacitance

Therefore, it may be impossible to design a variety of delay line circuits as desired.

And, forming thin film layers of inductors and capacitors requires man power and skill with a resultant rise in the production cost thereof.

Another object of this invention is to present means to overcome the aforementioned problems by adopting a composite which is a mixture of glass and dielectric material such as $BaTiO_3$ as a dielectric layer which enables the selection of desired dielectic constant when designing various delay lines.

BRIEF DESCRIPTION OF THE DRAWINGS

FIG. 7 is a plan view of an inductor of the embodiment shown in FIG. 1.

FIG. 8 is a side view of the inductor shown in FIG. 7.

FIG. 9 is a sectional view of an embodiment of a distributed constant type delay line in accordance with the present invention.

FIG. 10 is a perspective view of a housing in which an SIP type delay line is accommodated.

FIG. 11 is a plan view of a distributed constant type delay line of the present invention.

DETAILED DESCRIPTION OF THE PREFERRED EMBODIMENTS

Figure 1:
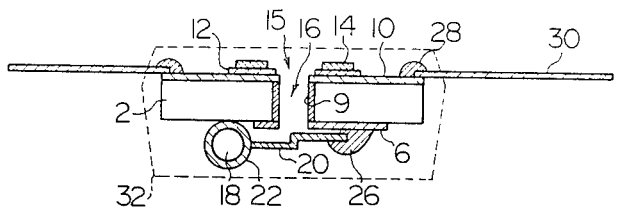
FIG. 1 is a sectional view of an embodiment of lumped constant type delay line in accordance with the present invention with a housing thereof removed.

First, the substances utilized for the inductor and capacitor according to the present invention will be described.

And, details of a conductive composite adopted in the present invention will be described hereunder.

In general, the conductive composite manufactured according to the present invention comprises a mixture of glass frit and fine particles which fine particles in turn comprise a mixture of metal components. The "fine particles" referred to here mean those having a mean particle size not larger than about 5 microns. The metal component includes, for example, Au, Ag, Cu, Pt, Pd, Ni, Al and so on. The conductive composite contains about 10-95% by volume of metal component.

And yet, the glass frit used in the conductive glass enamel composite according to this invention is a known product having a softening point lower than that of these aforementioned metal components. The most preferable glass frit, however, is borosilicate glass frit; that is, for example, a glass frit comprising bismuth, cadmium, barium, calcium or other alkaline earth metal borosilicate glass frits. A manufacturing process for producing such glass frits is well known.

Next, when manufacturing the conductive composite, the aforementioned metal particles are ground into powder until a desired particle size is obtained, followed by a ball mill treatment wherein the glass frits prepared in advance in a ball mill and metal particles are mixed together at an optimum ratio and finalized by further ball mill treatment involving the addition of water or butylacetatecarbitol to thoroughly mix the components in the ball mill.

Upon the completion of mixing the components, the viscosity of the mixture is adjusted to obtain a suitable composite by removing or adding a medium such as liquid.

After the conductive composite is disposed over a surface of an insulating substrate by screen printing or by employing a coating method, the product is dried for 5-15 minutes at a temperature ranging between 100° and 150° C., followed by sintering at 100°-1000° C. for about 10 to 60 minutes, whereby the layer of conductive composite is adhered to the surface of the insulating substrate.

Now, the dielectric composite will be described hereunder.

The dielectric composite manufactured according to the present invention is obtained by mixing $BaTiO_3$ with the glass frit of the metal components of the aforementioned conductive composite or by mixing other dielectric material therewith. The remaining elements used are the same as those used in the conductive composite, and as such, the detailed description thereof will be omitted.

In dielectric enamel composites manufactured from two types of composites, if dielectric constants of the two composites are expressed respectively by $\epsilon 1$, $\epsilon 2$, by mixing and agitating these two composites in an appropriate mixing ratio with respect to volume, a conductive composite having a desired dielectric constant can be produced. The theoretical formula to be applied is as follows:

$$\epsilon = [\epsilon\, \epsilon 2/(n\epsilon 1 + m\epsilon 2)]$$

$\epsilon 1$: dielectric constant for a dielectric composite (A)
$\epsilon 2$: dielectric constant for another dielectric composite (B)
m: volumetric ratio of the dielectric composite (A) employed
n: volumetric ratio of another dielectric composite (B)
$\epsilon$: dielectric constant of a dielectric composite obtained by mixing composites (A) and (B) at a ratio of m:n Next, the ferrite composite will be described hereunder.

The ferrite composite manufactured according to this invention is procured by mixing ferrite with the glass frit instead of the metal particles comprising the aforementioned conductive composite, while the remaining components are the same as those of the conductive glass enamel composite. As such, the detailed description, thereof will be omitted.

The ferrite composite is formed by screen printing or by coating the aforementioned mixture on a substrate.

In the ferrite composite, by adjusting a composite ratio of the glass composite to the ferrite composite, it is possible to select the desired permeability thereof in accordance with the following theoretical formula:

$$\mu i = (m\, \mu m)/(1 = n\mu m)$$

$\mu i$: permeability of the ferrite to be mixed
m: permeability of the ferrite composite
m: volumetric ratio of the ferrite to be mixed
n: volumetric ratio of the glass substance to be mixed In this invention a conductive composite comprising a mixture of an organic substance and enamel; a dielectric composite, comprising a mixture of an organic substance and enamel; and a composite comprising a mixture of an organic substance, enamel and ferrite can be employed instead of the aforementioned conductive composite, dielectric composite and ferrite composite respectively. The organic substance included in the composites referred to above is, for example, an epoxy organic compound instead of the glass frits used in the aforementioned conductive composites.

Now, an embodiment of lumped constant type delay lines and the manufacturing method thereof according to the present invention will be described with particular reference to the accompanying drawings.

First, a delay line of a coil wound type will be described.

Figure 5:
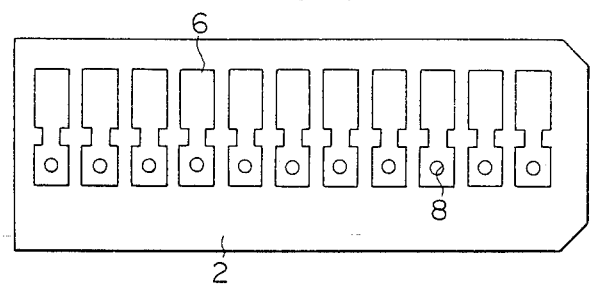
FIG. 5 is a plan view of an insulating substrate of the embodiment shown in FIG. 1 on which inductance electrodes are superposed.
Figure 6A:
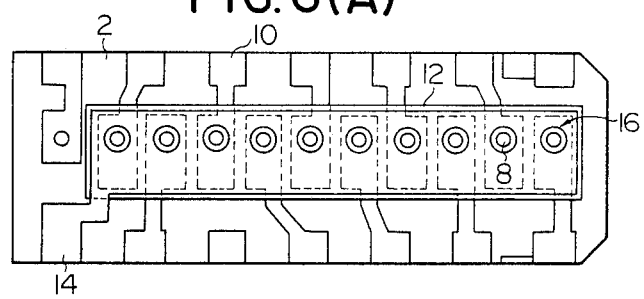
FIG. 6(A) is a plan view of the other surface of the insulating substrate shown in FIG. 5 on which condenser electrodes and a dielectric layer are disposed.
Figure 6B:
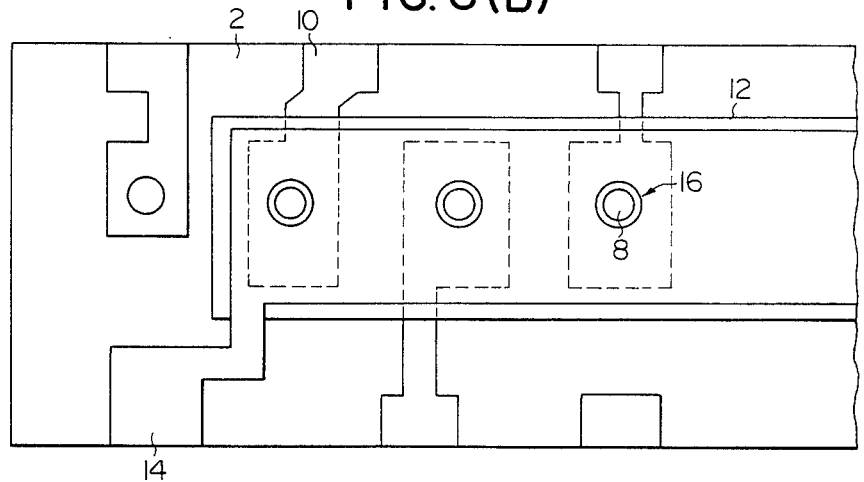
FIG. 6(B) is enlarged plane view of a section of the insulating substrate shown in FIG. 6(A).

FIG. 5 shows a insulating substrate 2 over one surface of which inductor electrodes 6 are disposed by printing conductive paste on the substrate followed by baking. And, an inside wall defining each through-hole 8 extending in the insulating substrate is coated with conductive paste 9 thereby constituting a so-called through-hole conductor section 16. FIGS. 6(A) and 6(B) illustrate the other surface of the substrate 2 over which is disposed a first condenser electrode 10 which is connected to the inductor electode 6 via the through-hole conductor section 16. A dielectric layer 12 composed of a dielectric substance is superposed on the first condenser electrode 10 and a second condenser electrode 14 is disposed over the dielectric layer 12 whereby a laminated condenser is obtained. Thus, a plurality of laminated condensers may be produced.

FIGS. 7 and 8 show an inductor 17 consisting of a single layer solenoid bobbin 18 formed of plastic or the like and around which is wound a conductor wire 22 with a prescribed pitch. Embodied in the bobbin 18 are a number of individual terminals 20. Each terminal 20 has a key shape as shown in FIG. 8. The conductor wire 22 is wound around the bobbin 18 with a prescribed pitch so that each of these terminals 20 forms one section.

Figure 4:
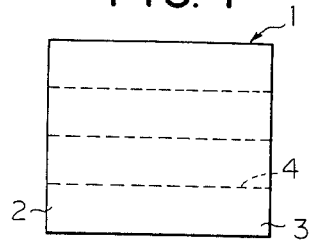
FIG. 4 is a plan view of an insulating plate, of the embodiment shown in FIG. 1, provided with breaking lines defined in parallel.

Shown in FIG. 4 is an insulating plate 1 that facilitates the manufacturing of a plural number of delay lines at one time in a continuous process. Breaking grooves 4 are defined at equal intervals in the insulating plate 1. The grooves help in the division of the plate 1 into a plural number of insulating substrates 2 on each of which is formed an individual delay line.

Now a process of manufacturing delay lines will be described hereunder.

Figure 2:
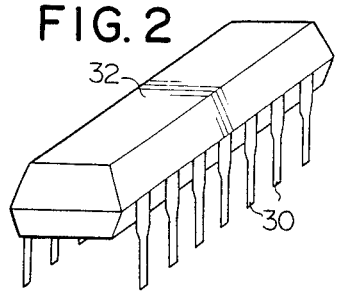
FIG. 2 is a perspective view of the delay line shown in FIG. 1 accommodated within a housing.
Figure 3:
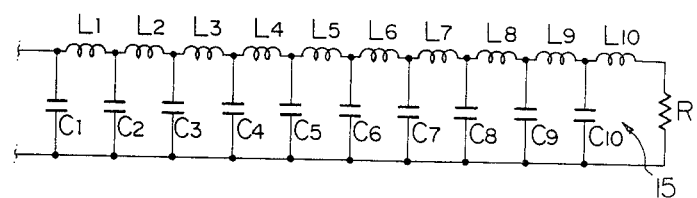
FIG. 3 is an equivalent circuit diagram of the lumped constant delay line.

First, solder paste 26 is placed on the surface of inductor electrode 6 and solder paste 28 is placed on the surface of the first condenser plate 10, respectively (as shown in FIG. 1). The inductor terminal 20 fixedly embedded in the bobbin 18 disposed below the substrate is fixed on the inductor electrode 6 by the solder paste 26 while a horizontally extending lead terminal 30 is fixed on the first condenser electrode 10 by the solder paste 28. The semi-finished product thus manufactured is shifted by a conveyor or the like through a soldering flow oven (not shown). The respective inductor terminals 20 and exterior lead terminals 30 are completely soldered to the pertinent members, whereby a delay line having an equivalent circuit as shown in FIG. 3 is manufactured. Subsequent processes for forming a housing 32 indicated by broken line in FIG. 1 include the transfer molding of the housing to the delay line and bending exterior lead terminals 30, whereby a complete DIP lumped constant type delay line, as shown in FIG. 2, is obtained.

Next, an efficient method of manufacturing delay lines according to the present invention will be described hereunder.

A plural number of breaking grooves 4 are defined in parallel in an insulating plate 1 as shown in FIG. 4. The insulating plate 1 thus provided with grooves 4 for breaking may be prepared in advance. By bending the plate along the grooves 4 the insulating plate 1 maybe broken into substrates 2 whereby a plurality of substrates may be obtained. But before the insulating plate 1 is divided into a plurality of substrates 2, a condenser 15 including condenser electrodes 10, 14 and a dielectric layer 12, an inductive electrode 6 and through-hole conductor section 16 are formed over a surface of each section 3 of the insulating plate 1 defined between grooves 4 by screen printing or by employing a coating method. After the substrate 2 is formed by breaking the insulating plate 1, lead terminals 30 and terminals 20 are connected to the first condenser electrodes 10 and inductor electrodes 6 by adhesive and soldering paste, respectively. The housing 32 is formed by transfer molding and the lead terminals 30 are bent downwardly. Thus, plural delay lines are produced efficiently by this manufacturing method.

The structure in which the through-hole conductor section 16 connects the inductor electrodes 6 and condensers 15 dispenses with the conventional soldering operation referred to herinbefore.

Now, another embodiment according to the present invention will be described hereunder with particular reference to the accompaying drawings.

This embodiment relates to a distributed constant type delay line equipped with coils coated with thick film.

In FIGS. 9 and 11, over the surface of an insulating substrate 2 is disposed a ground electrode layer 52 comprising a conductive composite.

To form this conductive glass (organic) enamel composite on the insulating substrate 2, the composite is applied thereon by means of screen printing or by employing a coating method followed by drying at temperatures of 100°-15° C. for 5-15 minutes so that the conductive composite adheres tightly to the insulating substrate 2. The thickness of the coating in a range between 2 and 30 m is considered to be an optimum condition. Next, over the conductive composite thus formed is superposed a dielectric layer 54 comprising dielectric composite.

When a dielectric layer 54 is composed of the mixture of two types of dielectric composites and assuming that the specific dielectric constant of the two composites are represented by $\epsilon 1$ and $\epsilon 2$, respectively, dielectric composite having a desired specific dielectric constant can be obtained by mixing these two composite at a desired volume ratio. The applicable theoretical formula is as follows $$\epsilon = (\epsilon 1 \epsilon 2)/(n \epsilon 1 + m \epsilon 2)$$

Next, by using the same quality of conductive composite as heretofore explained and by screen printing by performing a coating method, an inductance conductive layer 56 having the shape as shown in FIG. 11 is formed over the dielectric layer 54.

Figure 12:
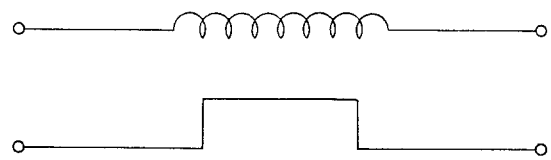
FIG. 12 is an equivalent circuit diagram of the delay line shown in FIG. 11.

By performing the above-described process, a distributed constant delay line having an equivalent circuit is obtained as shown in FIG. 12.

Still further, as the composite of the dielectric layer 54, a ferrite composite of $MO \cdot Fe_2O_3$ may be employed if M is a divalent metal atom so that MO refers to a metal oxide.

By adjusting the compositional ratio of glass and ferrite, a desired specific permeability for a ferrite composite can be obtained in accordance with the followig theoretical formula the parameters of which are as described heretofore:

$$\epsilon i = (m \cdot \mu m)(1 - n \mu m)$$

This composite layer is formed by screen printing or by performing a coating method. The description of the required process will be omitted because such is the same as that pertaining to the conductive glass (organic) enamel composite constituting the ground electrode layer 52.

By using a ferrite, especially a manga-zinc ferrite which is a mixture of MnO, Zno and $Fe_2O_3$, or a nickle-zinc ferrite which is a mixture of NiO, ZnO and $Fe_2O_3$, generally expressed by a formula $MO.Fe_2O_3$ with M being a divalent metal atom, for the formation of insulating substrate 2, it may be possible to efficiently confine magnetic flux generation in the inductor, with resultant raised apparent specific permeability of the ferrite composite layer.

As described heretofore, a described constant type delay line having a thickness ranging between 6–90 μm is formed by disposing plural composites over the surface of an insulating substrate 2. However, it is possible to change the position of ground electrode layer 52 with the position of inductance conductive layer 56.

Figure 13:
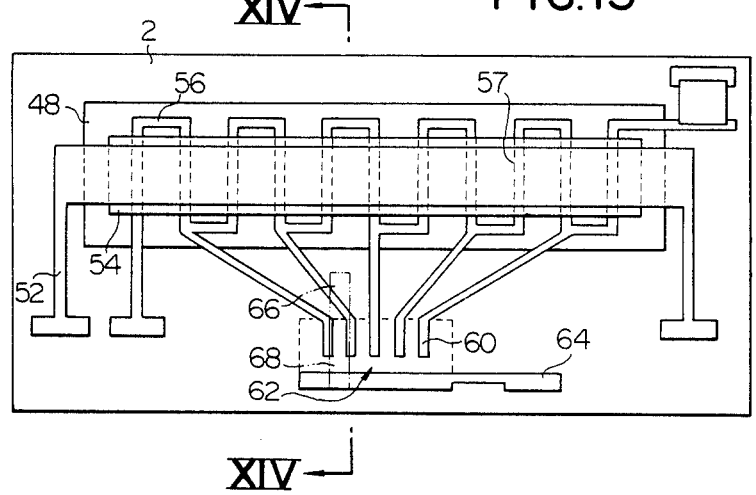
FIG. 13 is a plan view of another embodiment of a distributed constant type delay line according to the present invention.
Figure 14:
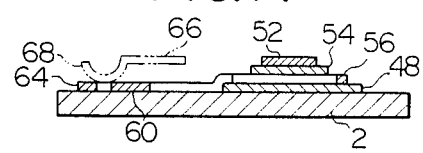
FIG. 14 is a sectional view of FIG. 13 taken along the line XIV—XIV.
Figure 15:
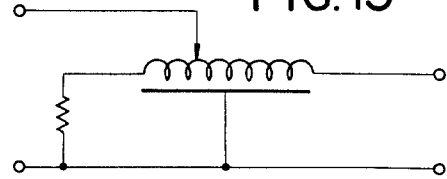
FIG. 15 is an equivalent circuit diagram of the delay line shown in FIG. 13.

FIGS. 13 and 14 illustrate distributed constant type delay lines wherein the positions of the ground electrode layer 52 are switched and the inductance conductive layer 56 are switched. As illustrated in FIGS. 9, 10 and 11, at the edges of the insulating substrate 2 are disposed conductor sections of the ground electrode layer 52 and conductor sections of inductance conductive layer 56 to which lead terminals 20 and 34 are connected respectively by means of soldering paste. A case 58 in which the substrate 2 and other pertinent members explained above are accommodated is made of plastic or the like whereby a so-called SIP type delay line is obtained.

A variable delay line of the distributed constant type is illustrated in FIGS. 13 and 14. On an insulating substrate 2 is superposed a ferrite layer 48 consisting of ferrite composite, over which is formed an inductance conductive layer 56 having a serpentine shape defining conducting paths 57 formed of conductive composite. From the conductor paths 57 are led out a bunch of taps 60 and all of the ends of taps 60 converge toward one side of an insulating substrate 2 so as to form a wiper base 62 having taps 60 arranged in parallel and on which a finger shaped wiper 66 may slide.

Over the surface of inductance conductive layer 56 is laid a dielectric layer 54 comprisng a dielectric composite and on which is superposed a ground electrode layer 52 consisting of conductive composite. A group of taps 60 led out from the inductance conductive layer 56 converge toward one side of an insulating substrate 2 so as to constitute a wiper base 62 as explained above in the description for FIG. 13. The curved sliding section 68 of a finger-shaped wiper 66, as illustrated in FIG. 13, slidably contacts both the wiper base 62 and an in-terminal 64 arranged in parallel therewith to thereby cause a variation of delay time. The wiper 66 is arraged to span two adjacent taps 60 and an in-terminal 64. The structure explained above is called a variable delay line of a distributed constant type.

The embodiments of the present invention provide a wide range of freedom in designing distributed constant delay lines and facilitate a mass production with a high rate of yield, thereof exhibiting superior quality.

What we claim is:

1. A lumped constant type delay line comprising:
an insulating substrate having opposed surfaces, and a through-hole extending therethrough and open to said surfaces;
a laminated condenser extending over one of said opposed surfaces,
said laminated condenser comprising a first condenser electrode disposed on said one of said surfaces and around said through-hole, a dielectric layer disposed on said first condenser electrode, and a second condenser electrode disposed on said dielectric layer;
an inductor extending over the other of said opposed surfaces,
said inductor comprising an inductance electrode disposed on said other of said opposed surfaces and around said through-hole, an inductor bobbin confronting and extending parallel to said other of said opposed surfaces, electrically conductive wire extending around said inductor bobbin, and a terminal pin extending from said inductor bobbin across said through-hole, said terminal pin connected to said inductance electrode; and
a coating of electrically conductive paste disposd on an inner peripheral wall of said substrate defining said through-hole, said coating extending from said first condenser electrode to said inductance electrode for electrically connecting said laminated condenser to said inductor.

2. A distributed constant type delay line comprising:
a substrate;
a ground electrode layer disposed on said substrate, said ground electrode layer comprising a conductive composite of electrically conductive metal particles and glass frit;
a dielectric layer disposed on said ground electrode layer, said dielectic layer comprising a mixture of dielectric material and glass frit; and
an inductance conductive layer extending along a serpentine path over said dielectric layer, said inductance conductive layer comprising a conductive composite of electrically conductive material and glass frit.

3. A delay in as claimed in claim 2, wherein said insulating substrate comprises a ferrite composite represented by the formula $$MO.Fe_2O_3$$

in which MO is a metal oxide with M representing a divalent metal atom.

4. A delay line as claimed in claim 3, wherein said ferrite composite is a magna-zinc ferrite composite comprising MnO, ZnO and $Fe_2O_3$.

5. A delay line as claimed in claim 3, wherein said ferrite composite is a nickle-zinc ferrite composite comprising NiO, ZnO and $Fe_2O_3$.

6. A delay line as claimed in claim 2, wherein said dielectric material of said dielectric layer is a ferrite composite represented by the formula $$MO.Fe_2O_3$$

in which MO is a metal oxide with M representing a divalent metal atom.

7. A delay line as claimed in claim 6, wherein said ferrite composite is a magna-zinc ferrite composite comprising MnO, ZnO and $Fe_2O_3$.

8. A delay line as claimed in claim 6, wherein said ferrite composite is a nickle-zinc ferrite composite comprising NiO, ZnO and $Fe_2O_3$.

9. A distributed constant type variable delay line comprising:

an insulating substrate;

a ferrite layer comprising a ferrite composite disposed on said insulating substrate;

an inductance conductive layer extending along a serpentine path over said ferrite layer, said inductance conductive layer comprising an electrically conductive composite, and said inductance conductive layer including a group of parallel taps disposed adjacent one another at a side of said substrate to form a wiper base, and respective led-out portions extending from locations disposed along said serpentine path to each of said taps, said lead-out portions collectively converging at said taps;

a dielectric layer comprising a dielectric composite disposed on said inductance conductive layer; and a ground electrode layer comprising an electrically conductive composite disposed on said dielectric layer.

* * * * *